(12) United States Patent
Bang

(10) Patent No.: US 10,912,238 B2
(45) Date of Patent: Feb. 2, 2021

(54) DISPLAY APPARATUS

(71) Applicant: LG Display Co., Ltd., Seoul (KR)

(72) Inventor: Hyo-Jin Bang, Changwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/600,435

(22) Filed: Oct. 11, 2019

(65) Prior Publication Data

US 2020/0170148 A1 May 28, 2020

(30) Foreign Application Priority Data

Nov. 27, 2018 (KR) .................. 10-2018-0148690

(51) Int. Cl.
| | | |
|---|---|---|
| *H02K 7/20* | (2006.01) | |
| *H05K 1/18* | (2006.01) | |
| *H05K 7/20* | (2006.01) | |
| *H05K 1/02* | (2006.01) | |

(52) U.S. Cl.
CPC ......... *H05K 7/20963* (2013.01); *H05K 1/189* (2013.01); *H05K 7/20509* (2013.01); *H05K 7/20954* (2013.01); *H05K 1/0209* (2013.01); *H05K 2201/066* (2013.01); *H05K 2201/10128* (2013.01)

(58) Field of Classification Search
CPC ............... H05K 7/20963; H05K 1/189; H05K 7/20509; H05K 2201/10128
USPC ..... 361/679.46, 679.54, 704, 707, 709, 714, 361/720

See application file for complete search history.

(56) References Cited

U.S. PATENT DOCUMENTS

| | | | | |
|---|---|---|---|---|
| 6,175,493 B1* | 1/2001 | Gold | ....................... | G06F 1/203 |
| | | | | 174/15.2 |
| 6,212,069 B1* | 4/2001 | Janik | ..................... | G06F 1/1616 |
| | | | | 165/86 |
| 6,377,452 B1* | 4/2002 | Sasaki | ..................... | G06F 1/203 |
| | | | | 165/104.33 |
| 6,493,226 B1* | 12/2002 | Noguchi | ................. | G06F 1/203 |
| | | | | 165/104.33 |
| 9,609,771 B2* | 3/2017 | Sakata | ....................... | G06F 1/20 |
| 2003/0223211 A1* | 12/2003 | Huang | ................. | H05K 9/0032 |
| | | | | 361/816 |
| 2006/0176672 A1* | 8/2006 | Kamemoto | .......... | H05K 7/2049 |
| | | | | 361/714 |
| 2011/0310572 A1* | 12/2011 | Murakami | ........... | G06F 1/1616 |
| | | | | 361/752 |
| 2012/0224329 A1* | 9/2012 | Li | ........................ | G06F 1/1656 |
| | | | | 361/720 |
| 2012/0318484 A1* | 12/2012 | Hirasawa | .......... | G02F 1/133385 |
| | | | | 165/134.1 |
| 2013/0141866 A1* | 6/2013 | Refai-Ahmed | ..... | H01L 23/3672 |
| | | | | 361/679.54 |

(Continued)

*Primary Examiner* — Stephen S Sul
(74) *Attorney, Agent, or Firm* — Polsinelli PC

(57) ABSTRACT

A display apparatus comprises a display panel; a heat sink plate coupled to a bottom surface of the display panel and having a coupling member that extends in a semicircular shape at one end and protrudes in a direction toward the bottom surface of the display panel; and a guide panel having a connection member at one end that is coupled to the coupling member in a rotation or sliding manner and connected to a bottom surface a printed circuit board (PCB) connected to the display panel, wherein the printed circuit board is detachably coupled to a bottom surface of the heat sink plate.

22 Claims, 7 Drawing Sheets

(56) References Cited

U.S. PATENT DOCUMENTS

2015/0092331 A1* 4/2015 Kinoshita ............. G06F 1/1616
           361/679.09
2015/0098247 A1* 4/2015 Shin ....................... G02B 6/009
           362/611
2017/0118832 A1* 4/2017 Roh ....................... H05K 1/021

* cited by examiner

DISPLAY APPARATUS

CROSS REFERENCE TO RELATED APPLICATION

The present application claims the benefit of Korean Patent Application No. 10-2018-0148690, filed on Nov. 27, 2018, which is hereby incorporated by reference in its entirety.

BACKGROUND

Field of the Disclosure

The present disclosure relates to a display apparatus, and more particularly to a display apparatus including a heat dissipation structure for dissipating the heat generated from a display panel.

Description of the Background

An image display for realizing various pieces of information on a screen becomes core technology of the information communication age and has been developed into a thinner, lighter, and higher-performance image display. Accordingly, a liquid crystal display for receiving light from a light source to realize an image, an organic light-emitting display that intrinsically emits light and thus obviates a light source unit, and the like have drawn attention as flat displays with reduced weight and volume that overcomes the disadvantages of the conventional display devices such as cathode ray tubes (CRTs).

Such a display is configured in such a way that a plurality of pixels is arranged in a matrix form to display an image. Here, each pixel includes a light-emitting device and a pixel-driving circuit including a plurality of transistors that independently drive the light-emitting device.

Recently, research has been actively conducted into a thin and light display panel, a display apparatus including a bendable or foldable/unfoldable display panel has been supplied, and a display apparatus having an edge part that is bent to display an image thereon has also been realized.

However, as a display apparatus becomes lighter and thinner, according to current trends, there has been a need for a structure for dissipating the heat generated from a display panel or a circuit board to the outside. Accordingly, there has been a need for research and development on designs for heat dissipation.

In addition, the conventional structure configured in such a way that a circuit board is attached to a bottom surface of a guide panel using double-sided adhesive tape has a problem of an inconvenient operation during a process in which a circuit board needs to be attached and detached.

The above information disclosed in this Background section is only for enhancement of understanding of the background of the described technology and therefore it may contain information that does not form prior art that is already known in this country to a person of ordinary skill in the art.

SUMMARY

Accordingly, the present disclosure is directed to a display apparatus that substantially obviates one or more problems due to limitations and disadvantages of the prior art.

More specifically, the present disclosure provides a display apparatus that has an enhanced heat dissipation structure coupled to the bottom surface of a display panel and configured to prevent a circuit board that generates a large amount heat and the bottom surface of the display panel from directly contacting each other and that is configured in such a way that a guide panel is selectively detachably coupled from a heat sink plate, to which the same is assembled during an assembly process.

Additional advantages, aspects and features of the present disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the present invention, as embodied and broadly described, a display apparatus comprises a display panel; a heat sink plate coupled to a bottom surface of the display panel and having a coupling member that extends in a semicircular shape at one end and protrudes in a direction toward the bottom surface of the display panel; and a guide panel having a connection member at one end that is coupled to the coupling member in a rotation or sliding manner and connected to a bottom surface a printed circuit board (PCB) connected to the display panel, wherein the printed circuit board is detachably coupled to a bottom surface of the heat sink plate.

In another aspect of the present disclosure, a display apparatus comprises a display panel; a heat sink plate coupled to a bottom surface of the display panel and including a coupling member that extends in a semicircular shape at one end and protrudes in a direction toward the bottom surface; and a guide panel having one end at which a connection member is disposed, the connection member coupled to the coupling member using a rotation or sliding method, and an interval is maintained between the heat sink plate and the guide panel.

In a further aspect of the present disclosure a display apparatus comprises a display panel; a heat sink plate coupled to a bottom surface of the display panel and having a coupling member extended to one end to protrude in a direction toward the bottom surface of the display panel; a guide panel including a connection member at one end that is rotatably or slidably engaged with the coupling member of the heat sink plate; a printed circuit board connected to the display panel and detachably engaged with a bottom surface of the heat sink plate; and a stopper configured to limit a coupling position between the coupling member and the connection member, wherein the heat sink plate and the guide panel are separated apart from each other by an air gap.

Accordingly, the display apparatus of the present disclosure is configured in such a way that the guide panel and the heat sink plate are capable of being attached to and detached from each other using a rotation or sliding method to satisfy the requirement for attachment and detachment in an assembly procedure.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspect(s) of the disclosure and together with the description serve to explain the principle of the disclosure.

In the drawings.

DETAILED DESCRIPTION

Figure 1:
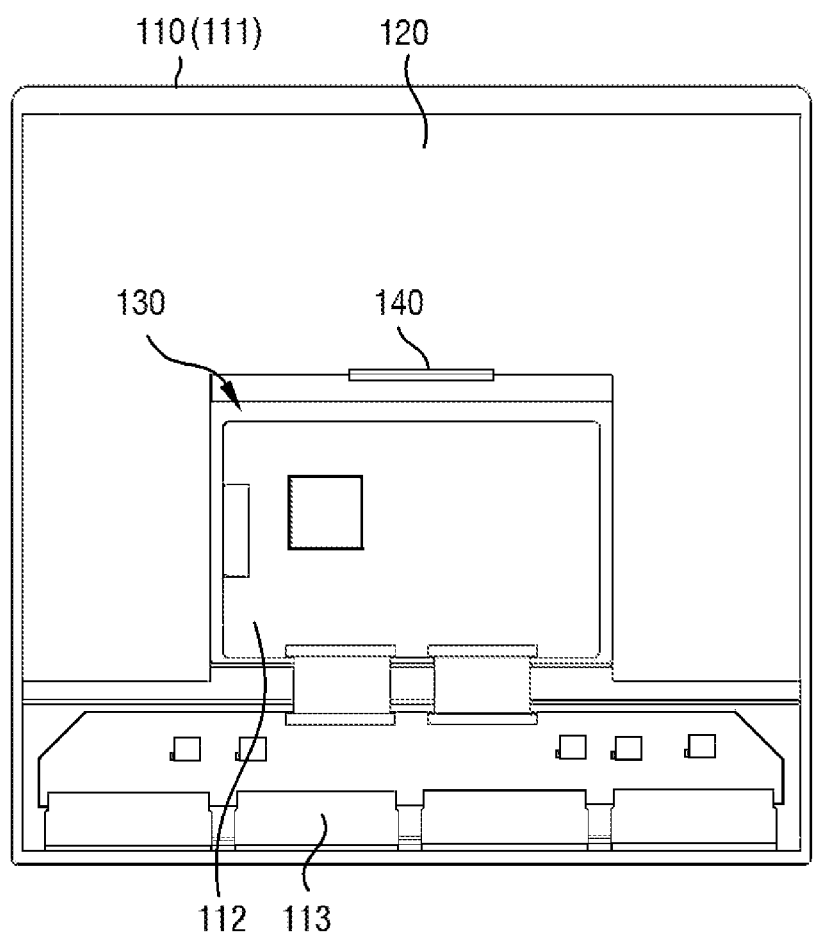
FIG. 1 is a bottom view showing a bottom surface (or rear surface) of a display apparatus according to an aspect of the present disclosure.

Exemplary aspects of the present disclosure are described in detail so that those of ordinary skill in the art may easily implement the same with reference to the accompanying drawings. Wherever possible, the same reference numbers will be used throughout the drawings to refer to the same or like parts. In addition, a detailed description of known functions and configurations will be omitted when it is determined that the subject matter of the present disclosure may be unnecessarily obscured. Any features shown in the drawings may be exaggerated, reduced, or simplified for ease of description, and the drawings and components shown therein are not always illustrated in proportion. However, those of ordinary skill in the art will easily understand these details.

FIG. 1 is a bottom view showing a bottom surface of a display apparatus according to an aspect of the present disclosure.

Referring to FIG. 1, a display apparatus 100 according to the present disclosure may include a display panel 110, a guide panel, and a heat sink plate.

First, the display panel 110 is configured to display an image through a pixel array in which subpixels are arranged in a matrix form. A basic pixel may include at least three subpixels that are capable of expressing white via a color combination of white (W), red (R), green (G), and blue (B) subpixels. For example, the basic pixel may include subpixels of an R/G/B combination, subpixels of a W/R/G combination, subpixels of a B/W/R combination, subpixels of a G/B/W combination, or subpixels of a W/R/G/B combination.

The display apparatus 100 includes a power supply and can generate and output various driving voltages required in a timing controller, a gate driver, a data driver, a display panel, a display apparatus, and the like using an input voltage. For example, the power supply may generate and supply a driving voltage of a digital circuit, which is applied to a data driver and a timing controller, a driving voltage of an analog circuit, which is applied to the data driver, a gate-on voltage (a gate high voltage) and a gate off voltage (a gate low voltage) that are used in the gate driver, and the like. The power supply may generate a plurality of driving voltages EVDD and EVSS, required to drive the display panel, and a reference voltage, and may supply the generated voltages to the display panel 110 through the data driver.

The timing controller may receive image data and basic timing control signals from an external system. The system may be any one of a computer, a television (TV) system, a set-top box, and a system of a portable terminal such as a tablet or a cellular phone. The basic timing control signals may include a dot clock, a data enable signal, a vertical synchronizing signal, a horizontal synchronizing signal, and the like.

The timing controller may generate and supply data control signals and gate control signals that control the driving timing of the data driver and the gate driver, respectively, using the basic timing control signals supplied from the outside and timing setting information (start timing, a pulse width, or the like) stored in an internal register.

The display panel 110 may include a haptic integrated touchscreen, and in this case, the touchscreen may be positioned between a cover glass 111 and the display panel. Here, the display panel may be applied to any of a liquid crystal panel, an organic light-emitting panel, a plasma panel, and the like. The cover glass 111 may be attached to the front surface of the display panel 110, may form the front appearance of the display apparatus, and may simultaneously perform a function of protecting the display panel.

A heat sink plate 120 may be attached to the bottom surface of the display panel 110 to support the display panel 110.

Herein, a guide panel 130 may be coupled to the bottom surface of the heat sink plate 120 and a circuit board 112 may be coupled to the bottom surface of the guide panel 130 to provide a function of dissipating heat generated from the circuit board 112. The guide panel 130 may be completely coupled to the bottom surface of the heat sink plate 120 and may then be firmly fixed by a fixing device 140. The fixing device 140 may be a tape or a hook-coupling structure, and although the drawing illustrates only a tape used for fixation, the guide panel 130 and the circuit board 112 are capable of sliding in a horizontal direction due to the presence of a predetermined clearance even in the state in which the guide panel 130 and the circuit board 112 are coupled to the heat sink plate 120, and thus the hook connection structure may optionally release a fixed state, unlike fixation with a tape structure.

Figure 2:
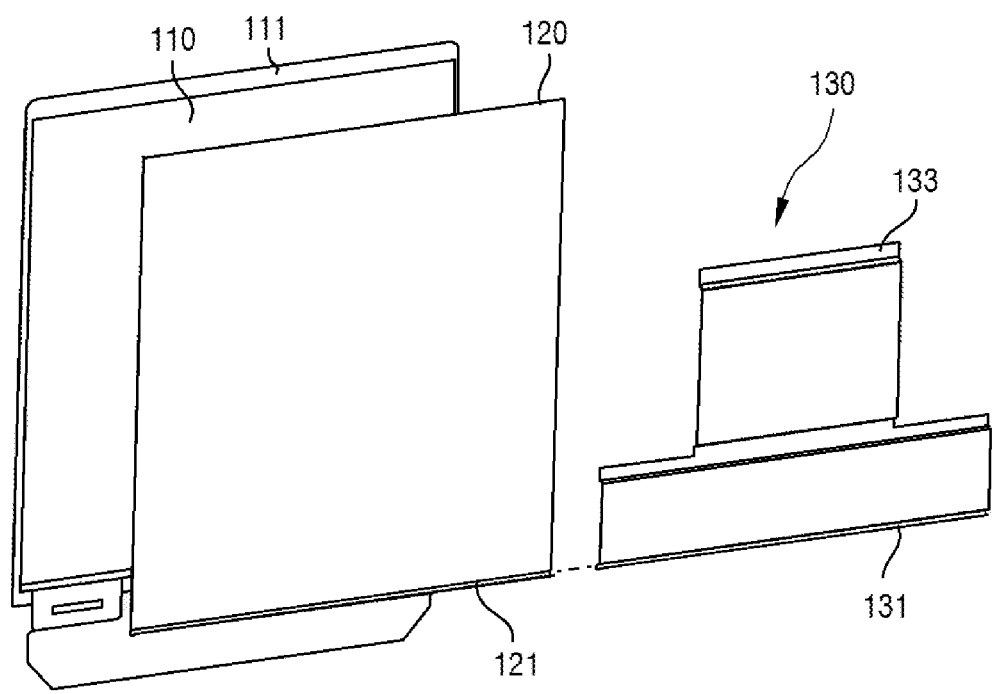
FIG. 2 is an exploded perspective view of the display apparatus shown in FIG. 1.
Figure 3:
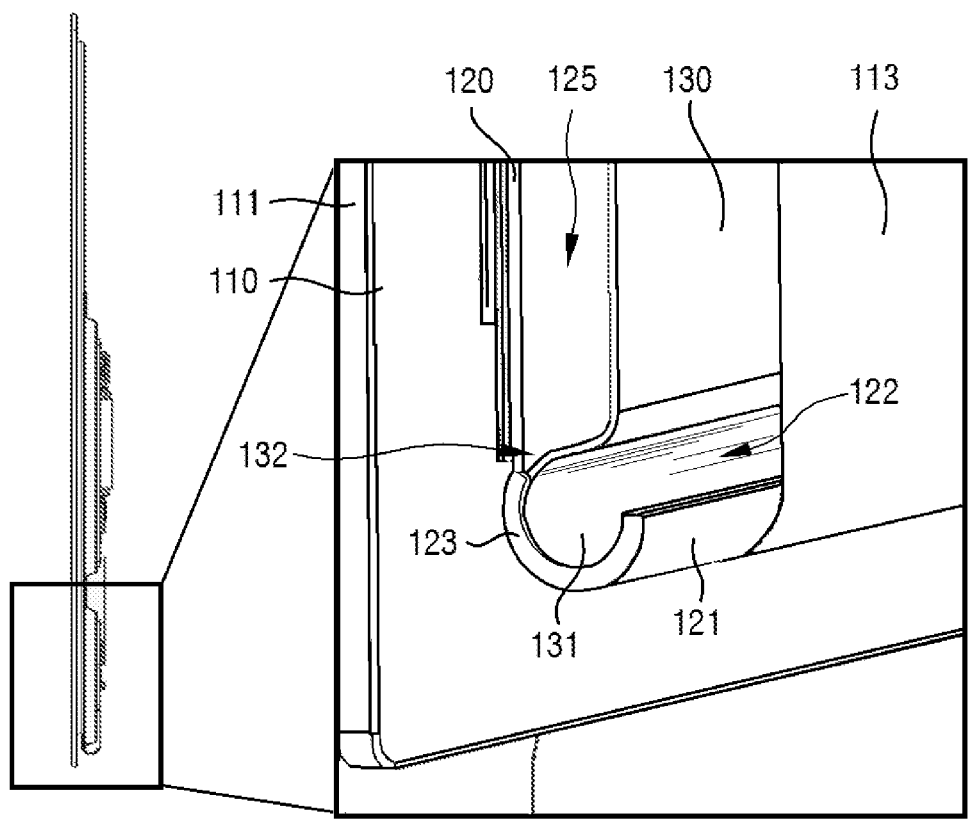
FIG. 3 is an enlarged partial view of a left side surface of the display apparatus shown in FIG. 1.

FIG. 2 is an exploded perspective view of the display apparatus shown in FIG. 1. FIG. 3 is an enlarged partial view of a left side surface of the display apparatus shown in FIG. 1.

Referring to FIG. 2, the display panel 110 may be coupled to the bottom surface of the cover glass 111, and the heat sink plate 120 may be attached to the bottom surface of the display panel 110. In this case, double-sided adhesive tape may be disposed between the display panel 110 and the heat sink plate 120 and may attach the display panel 110 and the heat sink plate 120 to each other.

When the heat sink plate 120 is attached to the bottom surface of the display panel 110, the guide panel 130 may be detachably coupled to the bottom surface of the heat sink plate 120, and a flexible printed circuit board 113 and the circuit board 112, which are connected to the display panel 110, may be attached to the bottom surface of the guide panel 130 in the state in which the flexible printed circuit board 113 and the circuit board 112 are connected to the display panel 110.

In this case, a coupling member 121 may be disposed at one end of the heat sink plate 120, and a connection member 131 may be disposed at one end of the guide panel 130 to correspond to the coupling member 121.

The coupling member 121 and the connection member 131 may have a cylindrical shape and may have the same center of rotation, and according to the present aspect, an example in which the connection member 131 is inserted into the coupling member 121 is described. Needless to say, a structure in which the coupling member 121 is inserted into the connection member 131 may also be applied. The heat sink plate 120 and the guide panel 130 may be formed of one of aluminum (Al), magnesium (Mg), silver (Ag), gold (Au), and copper (Cu) or an alloy including a plurality of materials thereamong to increase heat dissipation performance.

In the present aspect, the display apparatus may be manufactured in such a way that the diameter of the coupling member 121 is greater than the diameter of the connection member 131, and the connection member 131 may be inserted into the coupling member 121, and thus the heat sink plate 120 and the guide panel 130 may be coupled to each other.

Referring to FIG. 3, the heat sink plate 120 and the guide panel 130 may be spaced apart from each other by a predetermined interval. An air gap 125 may be formed in the interval, and thus the heat of the guide panel 130 may be prevented from being transferred directly to the heat sink plate 120, at the same time preventing the heat from flexible printed circuit board (FPCB) 113 and the circuit board 112 from being transferred to the heat sink 120, and the heat dissipation performance of the guide panel 130 may also be improved.

The coupling member 121 may have one section having an approximate 'C' shape, and thus the connection member 131 may be inserted into the coupling member 121 along a first open groove 122 that is provided in an at least semi-circular shape and is open. In this case, the connection member 131 also has a similar section, but has a diameter smaller than that of the coupling member 121 and is capable of being coupled to the coupling member 121. A second open groove 132, which is partially open, may also be formed in the connection member 131, and thus the second open groove 132 may have a smaller open size than that of the first open groove 122. Herein, the first open groove 122 may be disposed on an inner surface of the coupling member 121 and/or connection member 131 having an arc shape. In other words, the first open groove 122 may be disposed on a surface of the coupling member 121 and/or connection member 131 toward a center of a circle of a curved surface, and a second open groove 132 may be disposed between the surfaces of the coupling member 121 and connection member 131 opposite to each other.

A stopper 123 that limits a coupling position when the connection member 131 is slidably coupled to the coupling member 121 may be disposed at one end of the coupling member 121. The stopper 123 may be disposed at one side surface of the coupling member 121 so as to have a smaller external circumference than that of the coupling member 121, and thus the connection member 131 may contact the stopper 123 to set the coupling position while being coupled to the coupling member 121. FIG. 3 illustrates an example in which the stopper is disposed on one side surface of the coupling member 121, but the stopper may be disposed at any position as long as the coupling member 121 and the connection member 131 interfere with each other while being coupled to each other due to the stopper.

Figure 4:
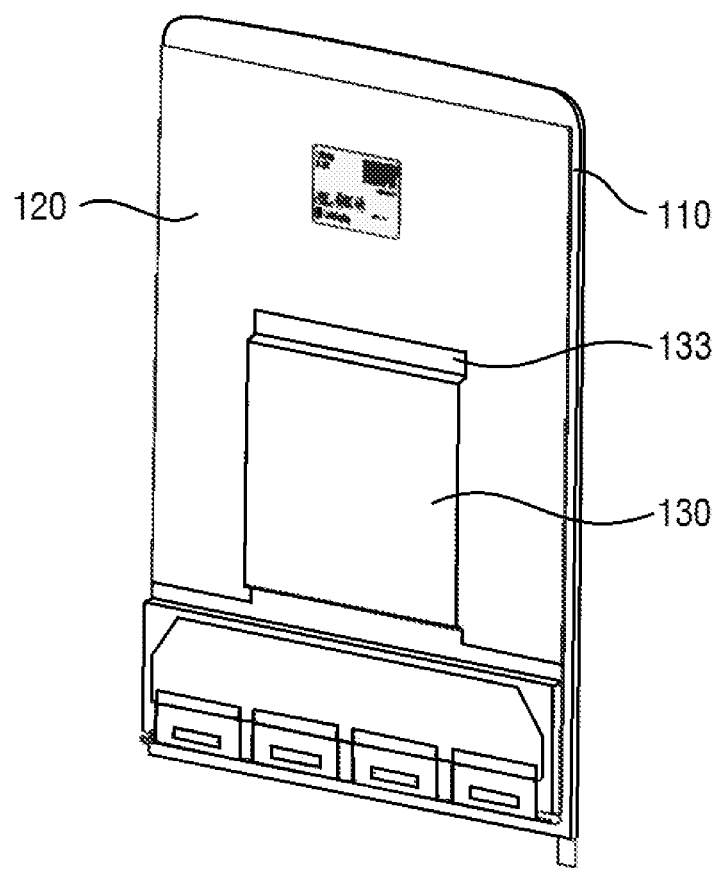
FIG. 4 is a perspective view showing a right bottom surface of the display apparatus shown in FIG. 1.

FIG. 4 is a perspective view showing the right bottom surface of the display apparatus shown in FIG. 1.

Referring to FIG. 4, the guide panel 130 may be completely coupled to the bottom surface of the heat sink plate 120. In this case, the guide panel 130 may include a fixing end 133 in order to permit the other end of the guide panel 130 to partially contact the bottom surface of the heat sink plate 120.

The fixing end 133 may maintain the air gap 125 between the guide panel 130 and the heat sink plate 120 in order to prevent heat from being transferred if the guide panel 130 and the heat sink plate 120 directly contact each other. Accordingly, the fixing end 133 may protrude in a direction toward the bottom surface of the heat sink plate 120 from the other end of the guide panel 130. Although not shown in the drawing, to reduce the contact area between the fixing end 133 and the bottom surface of the heat sink plate 120, a perforated pattern may be formed on the fixing end 133.

Figure 5:
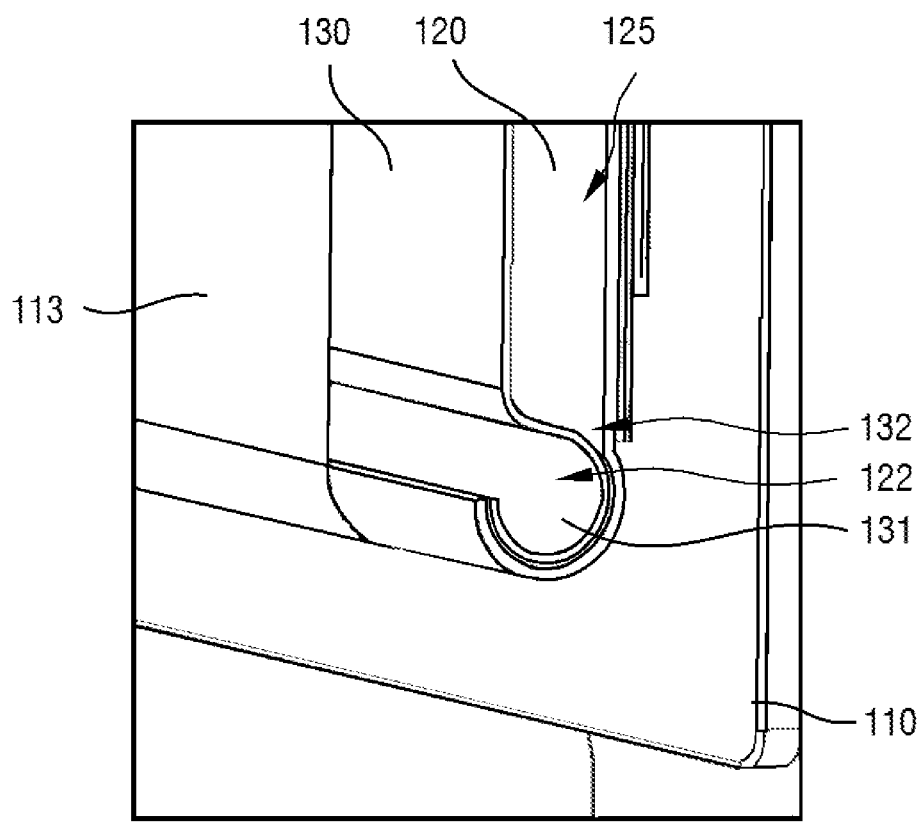
FIG. 5 is an enlarged partial view of a coupling portion between a heat sink plate and a guide panel from the bottom surface of the display apparatus shown in FIG. 4.

FIG. 5 is an enlarged partial view of a coupling portion between the heat sink plate 120 and the guide panel 130 from the bottom surface of the display apparatus shown in FIG. 4.

Referring to FIG. 5, the connection member 131 may be slidably coupled at the right side of the bottom surface of the coupling member 121. Needless to say, coupling may also be achieved via rotation. As shown in FIG. 3, the stopper is disposed at the left side of the coupling member 121, and thus the connection member 131 may be slidably coupled at the right side of the coupling member 121.

Each of the coupling member 121 and the connection member 131 has a section with a 'C' shape, and thus when at least one of the coupling member 121 or the connection member 131 is relatively rotated, the coupling member 121 and the connection member 131 may be decoupled.

Although not shown in the drawing, a guide portion with a larger diameter than the original diameter of the coupling member 121 may be disposed at the right end of the coupling member 121 for easy insertion of the connection member 131 at a start point for coupling the connection member 131 in FIG. 5.

Figure 6:
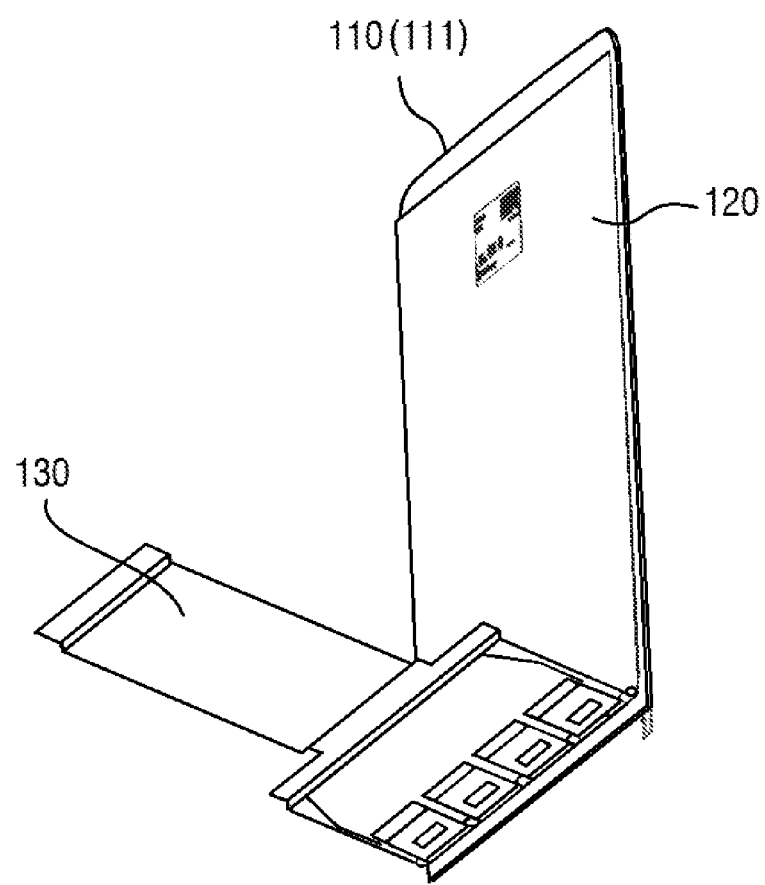
FIG. 6 is a perspective view showing the state in which a guide panel is rotated from the bottom surface of the display apparatus shown in FIG. 1.
Figure 7:
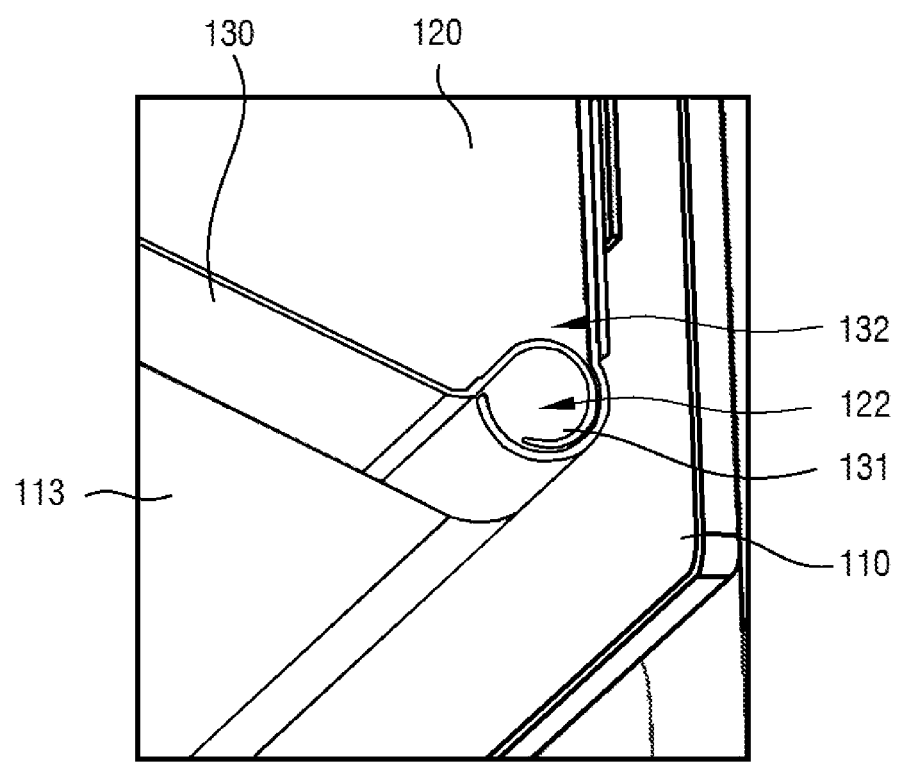
FIG. 7 is an enlarged partial view of a coupling portion between a heat sink plate and a guide panel from the bottom surface of the display apparatus shown in FIG. 6.

FIG. 6 is a perspective view showing the state in which the guide panel 130 is rotated from the bottom surface of the display apparatus shown in FIG. 1. FIG. 7 is an enlarged partial view of a coupling portion between the heat sink plate 120 and the guide panel 130 from the bottom surface of the display apparatus shown in FIG. 6.

Referring to FIG. 6, the guide panel 130 may be rotated while the state in which the fixing device 140 is fixed to the heat sink plate 120 is released.

In more detail, as shown in FIG. 7, when the first open groove 122 of the coupling member 121 and the second open groove 132 of the connection member 131 are open in different directions and then are rotated to face each other, the coupling member 121 and the connection member 131 may be decoupled.

In this case, the circuit board 112 attached to the bottom surface of the guide panel 130 may be connected thereto through the flexible printed circuit board (FPCB) 113 as well as the printed circuit board 112, and thus, even if the guide panel 130 is rotated, the guide panel 130 may be prevented from being damaged.

When the guide panel 130 is decoupled from the heat sink plate 120 and then an additional assembly process is completed, assembly may be performed again in the reverse order of the decoupling process.

Accordingly, in the display apparatus 100 according to the present disclosure, the air gap 125 may be disposed between the bottom surface of the display panel 110 and the circuit board 112, which generates the largest amount of heat, in order to prevent the bottom surface (or rear surface) of the display panel 110 and the circuit board 112 from directly contacting each other, thereby enhancing heat dissipation performance, and the heat sink plate 120 coupled to the bottom surface of the display panel 110 may be attached and detached to and from the guide panel 130, which is coupled to the heat sink plate 120 using a rotation or sliding method, and thus the guide panel 130 may be optionally attached and detached in an assembly procedure.

In the display apparatus according to the present disclosure, the air gap may be disposed between the bottom surface of the display panel and the circuit board, which generates the largest amount of heat, in order to prevent the bottom surface of the display panel and the circuit board from directly contacting each other, thereby enhancing heat dissipation performance, and the heat sink plate coupled to the bottom surface of the display panel may be attached to and detached from the guide panel coupled to the heat sink plate using a rotation or sliding method, and thus the guide panel may be optionally attached and detached in an assembly procedure.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display apparatus comprising:
   a display panel;
   a heat sink plate coupled to a bottom surface of the display panel and having a coupling member that extends in a semicircular shape at one end and protrudes in a direction toward the bottom surface of the di splay panel; and
   a guide panel having a connection member at one end that is coupled to the coupling member in a rotation or sliding manner and connected to a bottom surface of a printed circuit board (PCB) that is connected to the display panel,
   wherein the printed circuit board is detachably coupled to a bottom surface of the heat sink plate, and
   wherein, in a state in which the guide panel and the heat sink plate are coupled, an air gap is formed in an interval between surfaces of the guide panel and the heat sink plate which face each other.

2. The display apparatus of claim 1, wherein the connection member of the guide panel is coupled to the coupling member of the heat sink plate and has a same center of rotation on an inner circumference surface of the coupling member of the heat sink plate.

3. The display apparatus of claim 2, wherein the coupling member and the connection member have a plurality of open grooves that are at least partially open in a longitudinal direction.

4. The display apparatus of claim 3, wherein the plurality of open grooves include a first open groove and a second open groove, and
   wherein the first open groove is disposed on a surface of the coupling member and connection member toward a center of the semicircular shape and the second open groove is disposed between the surfaces of the coupling member and connection member facing to each other.

5. The display apparatus of claim 4, wherein the second open groove has a smaller open size than that of the first open groove.

6. The display apparatus of claim 1, wherein the guide panel and the heat sink plate are formed of at least one of aluminum (Al), magnesium (Mg), silver (Ag), gold (Au), and copper (Cu).

7. The display apparatus of claim 1, further comprising a stopper limiting a coupling position between the coupling member and the connection member.

8. The display apparatus of claim 7, the stopper limits a sliding distance of the coupling member with respect to the connection member in a longitude direction.

9. A display apparatus comprising:
   a display panel;
   a heat sink plate coupled to a bottom surface of the display panel and having a coupling member that extends in a semicircular shape at one end and protrudes in a direction toward the bottom surface of the display panel; and
   a guide panel having a connection member at one end that is coupled to the coupling member in a rotation or sliding manner and connected to a bottom surface of a printed circuit board (PCB) that is connected to the display panel,
   wherein the printed circuit board is detachably coupled to a bottom surface of the heat sink plate, and
   wherein the guide panel includes a fixing end that protrudes in a direction toward the bottom surface of the heat sink plate to allow another end of the guide panel to contact the bottom surface of the heat sink plate when the guide panel is completely coupled to the heat sink plate.

10. The display apparatus of claim 9, further comprising a fixing member configured to fix the fixing end to the bottom surface of the heat sink plate.

11. The display apparatus of claim 10, wherein the fixing member includes a tape or a hook connection structure.

12. The display apparatus of claim 9, wherein the connection member of the guide panel is coupled to the coupling member of the heat sink plate and has a same center of rotation on an inner circumference surface of the coupling member of the heat sink plate.

13. The display apparatus of claim 12, wherein the coupling member and the connection member have a plurality of open grooves that are at least partially open in a longitudinal direction.

14. The display apparatus of claim 13, wherein the plurality of open grooves include a first open groove and a second open groove, and
   wherein the first open groove is disposed on a surface of the coupling member and connection member toward a center of the semicircular shape and the second open groove is disposed between the surfaces of the coupling member and connection member facing to each other.

15. The display apparatus of claim 14, wherein the second open groove has a smaller open size than that of the first open groove.

16. The display apparatus of claim 9, further comprising a stopper limiting a coupling position between the coupling member and the connection member.

17. The display apparatus of claim 16, the stopper limits a sliding distance of the coupling member with respect to the connection member in a longitude direction.

18. A display apparatus comprising:
   a display panel;
   a heat sink plate coupled to a bottom surface of the display panel and having a coupling member extended to one end to protrude in a direction toward the bottom surface of the display panel;

a guide panel including a connection member at one end that is rotatably or slidably engaged with the coupling member of the heat sink plate;

a printed circuit board connected to the display panel and detachably engaged with a bottom surface of the heat sink plate; and a stopper configured to limit a coupling position between the coupling member and the connection member, wherein the heat sink plate and the guide panel are separated apart from each other by an air gap.

19. The display apparatus of claim 18, the stopper limits a sliding distance of the coupling member with respect to the connection member in a longitude direction.

20. The display apparatus of claim 18, wherein the guide panel includes a fixing end that protrudes in a direction toward the bottom surface of the heat sink plate to allow another end of the guide panel to contact the bottom surface of the heat sink plate when the guide panel is completely coupled to the heat sink plate.

21. The display apparatus of claim 20, further comprising a fixing member configured to fix the fixing end to the bottom surface of the heat sink plate.

22. The display apparatus of claim 18, wherein the coupling member and the connection member have a plurality of open grooves that are at least partially open in a longitudinal direction.

\* \* \* \* \*